US006338805B1

(12) United States Patent
Anderson

(10) Patent No.: US 6,338,805 B1
(45) Date of Patent: Jan. 15, 2002

(54) PROCESS FOR FABRICATING SEMICONDUCTOR WAFERS WITH EXTERNAL GETTERING

(75) Inventor: Gary L. Anderson, St. Ann, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/352,980

(22) Filed: Jul. 14, 1999

(51) Int. Cl.[7] .......................... B44C 1/22; H01L 21/302
(52) U.S. Cl. .............................. 216/89; 216/88; 216/67; 438/471; 438/691; 438/692
(58) Field of Search .............................. 216/88, 89, 67; 438/471, 474, 691, 692

(56) References Cited

U.S. PATENT DOCUMENTS

| 5,066,359 | A | * | 11/1991 | Chiou | ........................ 216/88 |
| 5,223,734 | A | | 6/1993 | Lowrey et al. | |
| 5,238,532 | A | | 8/1993 | Zarowin et al. | ............ 156/643 |
| 5,290,382 | A | | 3/1994 | Zarowin et al. | ............ 156/345 |
| 5,291,415 | A | | 3/1994 | Zarowin et al. | ......... 364/473.3 |
| 5,539,245 | A | | 7/1996 | Imura et al. | |
| 5,800,725 | A | | 9/1998 | Kato et al. | ..................... 216/88 |
| 5,851,924 | A | | 12/1998 | Nakasawa et al. | .......... 435/691 |
| 5,855,735 | A | * | 1/1999 | Takada et al. | ............ 156/636.1 |
| 5,942,445 | A | | 8/1999 | Kato et al. | |
| 5,993,493 | A | * | 11/1999 | Takamizawa et al. | ...... 29/25.01 |

FOREIGN PATENT DOCUMENTS

| EP | 0 319 805 A1 | 6/1989 |
| EP | 0 684 638 A2 | 11/1995 |
| EP | 0 798 766 A1 | 3/1997 |
| JP | 09-270400 A | 10/1997 |
| JP | 09-312274 A | 12/1997 |
| JP | 10-080861 A | 7/1998 |
| JP | 11-67777 A1 | 3/1999 |
| KR | 97008392 A | 2/1997 |
| KR | 97013089 A | 3/1997 |

OTHER PUBLICATIONS

Seimitsu Kikai, Double Side Polishing for VLSI of Silicon Wafer—One Side Mirror Polishing Considered with Etched Wafer Roughness; Journal of the Japan Society of Precision Engineering, vol. 59, No. 7, pp. 1163–1168.
PCT International Application No. PCT/US 00/18965 Search Report, filing date Jul. 12, 2000.

* cited by examiner

Primary Examiner—Randy Gulakowski
Assistant Examiner—Shamim Ahmed
(74) Attorney, Agent, or Firm—Senniger, Powers, Leavitt & Roedel

(57) ABSTRACT

A method of fabricating a semiconductor wafer is disclosed. The method reduces the number of processing steps and produces a low cost semiconductor wafer having external gettering. The method includes slicing the wafer from a single silicon crystal ingot and etching the wafer to clean impurities and residue from slicing. Thereafter, the wafer is double side polished which creates damage on both the front and back surfaces. The damage on the front surface is then removed in a subsequent plasma assisted chemical etching step and touch polishing operation which significantly improves the flatness of the wafer. The damage on the back surface created by the double side polishing remains and getters defects from the front surface and bulk regions of the wafer.

17 Claims, 2 Drawing Sheets

PROCESS FOR FABRICATING SEMICONDUCTOR WAFERS WITH EXTERNAL GETTERING

BACKGROUND OF THE INVENTION

The present invention relates to a process for fabricating semiconductor wafers. More specifically, the present invention relates to a simplified process for fabricating semiconductor wafers wherein modified double side polishing is used in combination with plasma assisted chemical etching to create a flat semiconductor wafer capable of extrinsically gettering and removing impurities from both the finished front surface of the wafer and the wafer bulk to the back surface during processing and device manufacturing.

Semiconductor devices are generally fabricated on a silicon semiconductor wafer which has been sliced from a single crystal silicon ingot grown by the so-called Czochralski method. In this process, polycrystalline silicon ("polysilicon") is charged to a crucible, the polysilicon is melted, a seed crystal is immersed into the molten silicon and a single crystal silicon ingot is grown by slow extraction.

As illustrated in FIG. 1, after the wafers are sliced (A) from the monocrystalline ingot, the wafers are conventionally treated with a number of processing steps to produce "finished" silicon wafers having a mirror-like front surface ready for device manufacturing. These steps include etching (B) and cleaning (C) the sliced wafer to remove contaminants and debris produced during the slicing operation (A), lapping/grinding (E) the front surface, cleaning (F) and etching (G) the front surface, and polishing the front surface with a pre-polish (H) and a final touch polish (I) prior to a final cleaning step (J) to produce a finished wafer. Additional flattening steps are also generally employed to decrease total thickness variation, or "TTV," which is frequently used to measure global flatness variation, which is the difference between the minimum and maximum wafer thickness. Flatter wafers are generally more desirable for device manufacturing. Also, an optional laser marking step (D) may be employed early in the process for wafer identification. In order to getter unwanted impurities and contaminants such as transition or heavy metals from the bulk and front surface regions of the wafer to improve various properties of the wafer, a separate external gettering step (K) is required during wafer processing. This gettering step is generally performed prior to final touch polishing to eliminate contamination of the finished front surface of the wafer.

Although several methods are available to create external gettering of the wafer, the most common include processes such as polysilicon coating or sandblasting to form a deformation layer on the back surface of the wafer to attract impurities away from the front surface and bulk region of the wafer. Recently, external gettering of the wafer has been created by diffusing phosphorous into the back surface of the wafer. These methods each require a separate processing step which increases the complexity and cost of the manufacturing process. Additionally, polysilicon coating or phosphorous diffusion may lead to contamination of the front surface of the wafer during processing, and thus may require the use of "masking" layers to increase effectiveness. This further adds to the time and cost of producing wafers having external gettering. As such, a need exists in the semiconductor industry for a low cost, improved method of processing semiconductor wafers having external gettering.

SUMMARY OF THE INVENTION

Among the objects of the present invention, therefore, are the provision of an improved process for manufacturing semiconductor wafers; the provision of a process for manufacturing semiconductor wafers having external gettering created without additional processing steps; the provision of a process for manufacturing extremely flat semiconductor wafers; the provision of a semiconductor manufacturing process which produces wafers with a decreased number of defects; and the provision of a semiconductor manufacturing process which eliminates the need for grinding/lapping operations.

Briefly, therefore, the present invention is directed to a process for fabricating a semiconductor wafer with extrinsic gettering. The process comprises first subjecting both the front and back surfaces of the wafer to a double side polishing operation to remove material from both surface and create damage on both surfaces. Next, the front surface of the wafer is subjected to a plasma assisted chemical etching operation to flatten the wafer and remove damage from the front surface caused by the double side polishing operation. Finally, the front surface of the wafer is subjected to a touch polishing operation to prepare the wafer for further device manufacturing.

The invention is further directed to a process for fabricating a semiconductor wafer with extrinsic gettering. The process comprises first slicing the wafer from a silicon ingot and etching the wafer to remove slicing residue. Next, both the front and back surfaces of the wafer are subjected to a double side polishing operation to remove material and create damage on both surfaces. After a cleaning operation, the front surface of the wafer is subjected to a plasma assisted chemical etching operation to flatten the wafer and remove damage from the front surface. Finally, the wafer is rinsed, polished, and cleaned to produce a finished wafer.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

In accordance with the present invention, it has been discovered that extremely flat semiconductor wafers having back surface extrinsic gettering of the bulk and front surface regions of the wafer can be fabricated in a simplified process by creating damage on the back surface of the wafer during a double side polishing step which is carried throughout the wafer fabrication process. Surprisingly, it is not necessary to etch, sandblast, or otherwise treat the back surface of the semiconductor wafer in a separate processing step to enhance the gettering characteristics of the wafer. The combination of double side polishing and front surface plasma assisted chemical etching is sufficient to create back surface gettering and overall wafer flatness.

Figure 1:
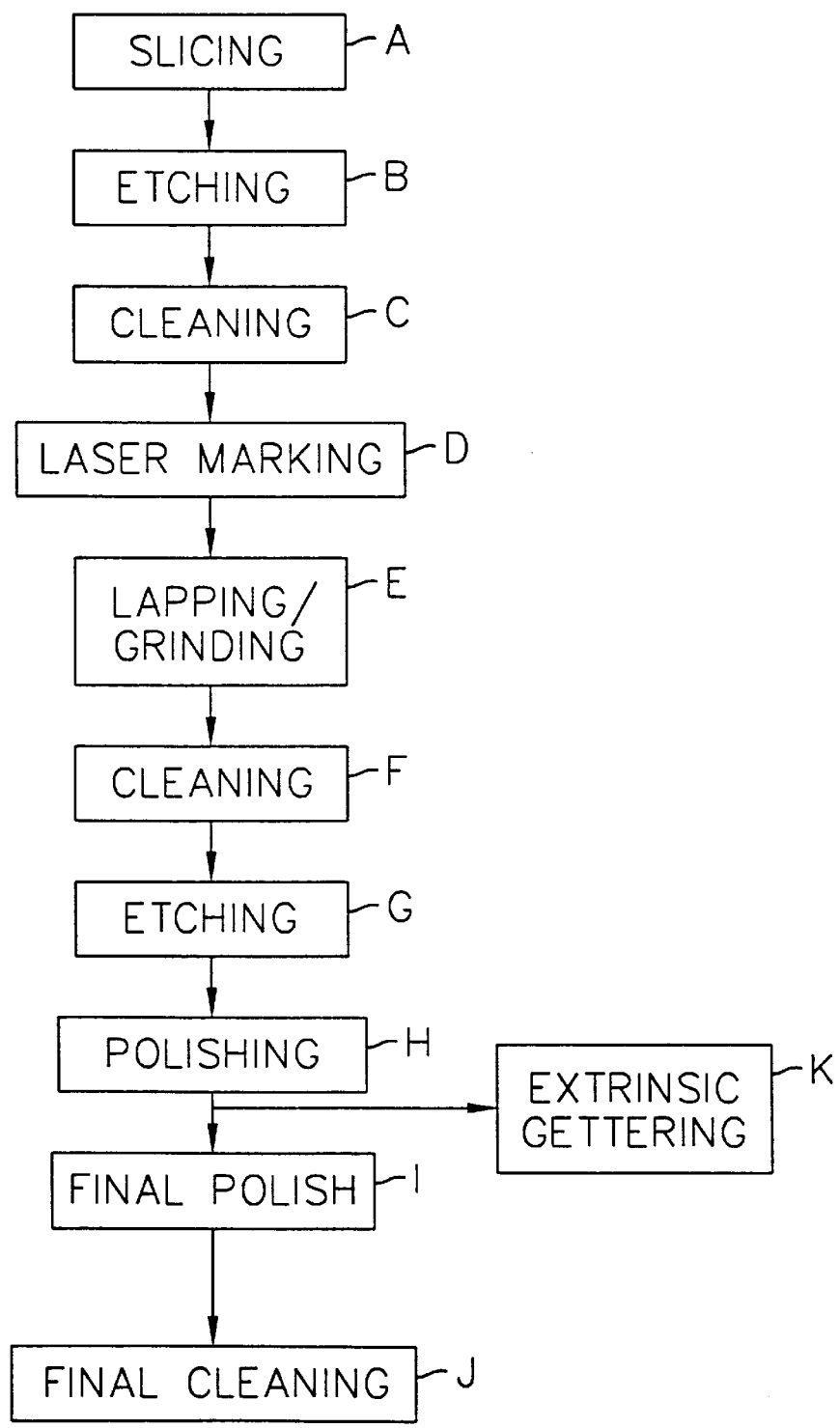
FIG. 1 is a flow chart showing a prior art process for manufacturing semiconductor wafers having external gettering.
Figure 2:
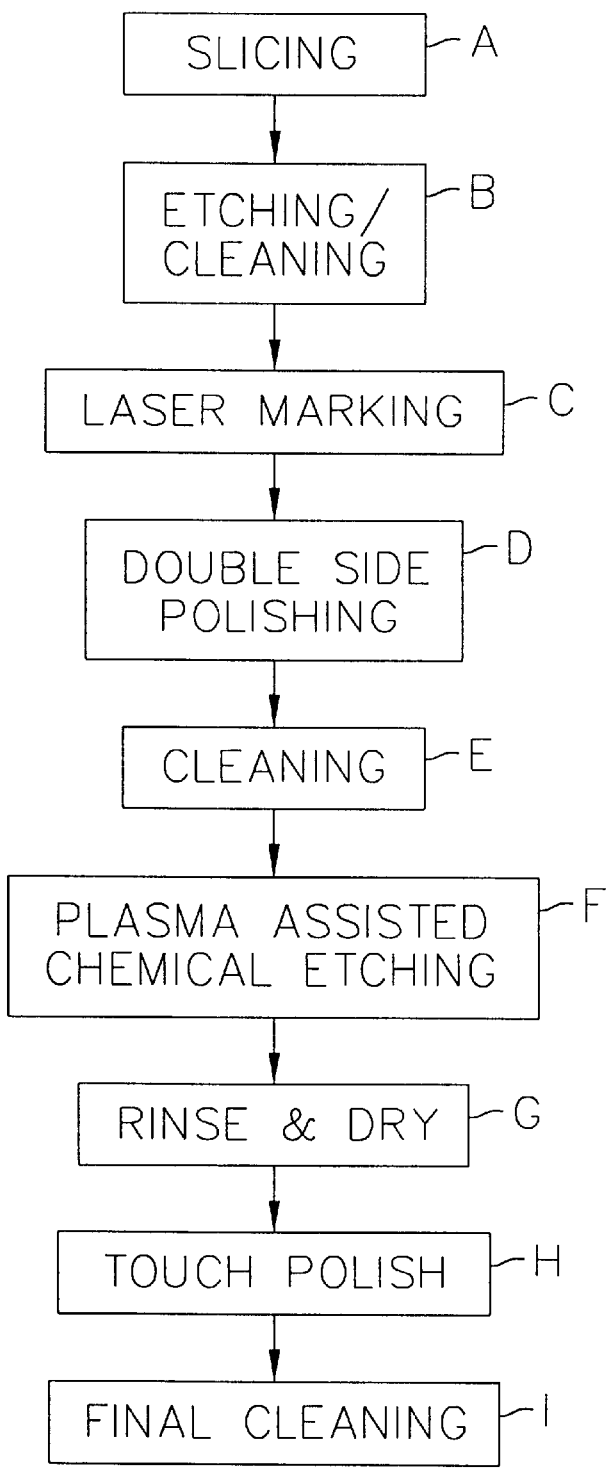
FIG. 2 is a flow chart showing an embodiment of a process for manufacturing semiconductor wafers having external gettering according to the present invention.

The preferred embodiments of the present invention are described in accordance with FIG. 2, which is an embodiment of the present invention. In a slicing step (A), a single crystal ingot formed by a pulling process as discussed in the Background of the Invention is sliced using either an internal diameter or wire saw at a predetermined angle with respect to the crystal lattice to produce numerous wafers having a thin disk shape. Such processes are well known to those skilled in the are. The initial thickness of each wafer is substantially greater than the desired end or final thickness to allow for the removal of wafer material from the front and back surfaces during subsequent processing operations without the risk of permanently damaging or fracturing the wafer. After slicing, the wafers are generally subjected to a conventional short alkaline etching/cleaning process (B) using, for example, a 45% solution of NaOH or KOH, to remove slicing residue and damage from cutting such as cracking on the wafer surfaces and create a relaxed surface. This etching process may include sequential tanks of etching solution, cleaning solution and water rinses. Approximately 2 to 10 micrometers of material is removed from both the front and the back surface of the wafer during etching. Those skilled in the art will realize that subjecting the wafer to an immersion etching operation in caustic etchants tends to deteriorate the overall flatness of the wafer.

The etched wafer is then optionally subjected to a conventional laser marking process (C) to create serial numbers and/or other identification characters on the wafer surfaces by scanning a pulsed laser. Optionally, the laser marking may occur later in the process after double side polishing and plasma assisted chemical etching.

The wafer is next subjected to a double side polishing operation (D) for concurrent polishing of the front and back surfaces of the wafer to flatten the wafer and remove any severe damage that may have been created during prior processing steps. One type of conventional double side polishing machine is manufactured by Peter Wolters under the model designation Double Side Polisher AC2000. Construction and operation of a conventional double side polishing machine for polishing semiconductor wafers is well known to those skilled in the art and will only be summarily described herein.

The machine includes a rotating lower plate having a polishing surface defined by a polishing pad, and a carrier seated on the polishing pad that is rotatable relative to the rotating lower plate and polishing pad. Wafers are held in the carrier with a front surface of each wafer engaging the polishing pad. A second polishing pad facing opposite the front surface of the wafer is mounted on an upper plate. This upper plate is attached to a motor driven spindle that rotates the upper plate and polishing pad relative to the wafer carrier and the lower plate. The spindle is capable of being moved up and down along a vertical axis for moving the second polishing pad into polishing engagement with the back surface of the wafer to sandwich the wafer between the two polishing pads. The pressure exerted on the wafer by the pads is preferably between about 1 psi and about 5 psi, most preferably about 3 psi. The damage created on the wafer surfaces is generally between about 2 and about 6 micrometers deep, preferably between about 3 and about 5 micrometers deep, and most preferably about 4 micrometers deep. After the double side polishing is complete, the total thickness variation of the wafer is preferably about 1 micrometer, and most preferably less than 1 micrometer.

During the double side polishing operation a slurry containing abrasive particles is applied between the polishing pads and the wafer to help polish the surface of the wafer. In accordance with the present invention, it is preferred that the polishing slurry utilized be alumina in water or glycerin or cerium oxide in water or glycerin. Preferably, the resulting pH of the polishing slurry is between about 6 and about 10.5, with a higher pH resulting in a faster rate of material removal. Preferably, the particle sizes range from between about 1 to about 10 micrometers, more preferably between about 2 to about 6 micrometers, and most preferably between about 3 and about 5 micrometers. It would be recognized by one skilled in the art that conventional slurries such as SYTON HT-50 manufactured by DuPont of Wilmington Del. would also be suitable for use in the present invention.

The polishing pads work the slurry against the surfaces of the wafer to concurrently and uniformly remove material from the front and back surfaces of the wafer and help improve the overall flatness of the wafer. As both surfaces of the wafer are polished, silicon is removed and some damage is created on the surface by the abrasive action of the alumina, cerium oxide, or other slurry. The damage created by the polishing slurry on the front surface is subsequently removed in the next operation discussed below. In a preferred embodiment of the present invention, the damage created on the back surface of the wafer is not subsequently removed, and the damage provides gettering sites for extrinsic gettering of impurities from the bulk and front surface regions of the wafer during subsequent processing operations and device manufacturing. It would be recognized by one skilled in the art that if extrinsic gettering of the wafer is not desired, the damage on the back surface of the wafer can be subsequently removed to eliminate unwanted extrinsic gettering.

After the double side polishing operation, the wafer may optionally be subjected to a cleaning operation (E) prior to further processing. This cleaning operation removes contaminants such as organics, metals, and various other particles from the wafer surfaces that may have been deposited from prior processing steps. Standard cleaning processes such as the well-known "RCA" type cleaning are acceptable. Typically, in an "RCA" cleaning procedure the wafer is immersed in a solution of $H_2O$—$NH_4OH$—$H_2O$ in an approximate ratio of about 5:1:1 by volume. The solution is maintained at a temperature of about 65 to about 85° C. After approximately 5 to 15 minutes in the solution, the wafer is removed and rinsed in water. After rinsing, the wafer is immersed for about 15 seconds in a 10:1 HF solution to remove any oxide formed during the first step. Next, the wafer is immersed in a solution of $H_2O$—$HCl$—$H_2O_2$ in a ratio of about 6:1:1 by volume heated to about 65 to about 80° C. After about 5 to about 15 minutes in the HCl solution, the wafer is rinsed and dried. One skilled in the art would realize that other conventional cleaning processes would also be acceptable to remove unwanted contaminants.

After double side polishing, and possibly the optional cleaning operation, the front surface of the wafer is subjected to a plasma assisted chemical etching (PACE) operation (F) to significantly increase to overall flatness of the wafer, as well as partially remove damage imparted on the front wafer surface during previous processing steps such as the double side polishing. The back surface of the wafer is not subjected to the plasma etching, and hence, the damage imparted in the previous double side polishing operation remains in tact to act as an extrinsic gettering sink. In the PACE process, an electrically charged plasma generates a chemically reactive species from a gas such as sulfur hexafluoride and the surface of the substrate facing the plasma etching electrode (the front surface) is etched or thinned at defined locations according to a generated dwell time versus position map to improve the overall flatness of the wafer, as well as decrease damage on the front surface. Conventional PACE processes are described in U.S. Pat. Nos. 5,238,532, 5,290,382, and 5,291,415.

In accordance with a preferred embodiment of the present invention, after the double side polishing operation, the PACE operation significantly flattens the wafer by removing between about 1 micrometer and about 10 micrometers, preferably between about 1 micrometers and about 5 micrometers, and most preferably between about 1 micrometer and about 2 micrometers of material from the front surface of the wafer. This material removal also partially removes damage on the front surface induced by prior processing steps such as the double side polishing. After the PACE operation, the wafer preferably has total thickness variation of between about 0.1 micrometers and about 0.8 micrometers and more preferably between about 0.1 and about 0.3 micrometers.

After the PACE operation on the front surface is complete, the wafer may optionally be subjected to a deionized water rinsing operation (G) to remove any excess sulfur or other contaminants on the wafer generated by the plasma or contact gas from the PACE operation. Such contamination can interfere with subsequent processing or device manufacturing steps. The wafer may be rinsed with deionized water and dried by spin drying or isopropyl alcohol vapor (IPA) drying prior to further processing.

Finally, the front surface of the wafer is subjected to a touch polishing operation (H) to significantly reduce haziness and increase the gloss on the front surface and prepare the front surface of the wafer for further device manufacturing. In accordance with the present invention between about 0.2 and about 10 micrometers of silicon will be removed in this touch polish step, depending upon the desired resulting total thickness variation. The resulting total thickness variation is preferably between about 0.1 micrometers to about 4 micrometers, preferably between about 0.1 and about 0.4 micrometers. The polishing may be carried out by a chemical/mechanical polishing process using, for example, a dilute ammonia stabilized colloidal silica slurry and conventional polishing equipment. A preferred ammonia stabilized colloidal silica slurry has a silica content of from about 8% to about 10% and a particle size of from about 0.025 to about 0.035 micrometers. If the ammonia stabilized silica slurry is not diluted prior to use, the polished wafer will not be as smooth as a wafer treated with a diluted slurry. A dilution of about one part silica slurry to about 10 parts deionized water is preferred. The touch polishing of the front surface of the wafer can be carried out using either a free mount polishing apparatus or a wax mount process, both of which are known in the art.

After the touch polishing operation, the wafer may optionally be subjected to a final cleaning operation (I) to remove organics, metals or other particulates to levels specified by device manufactures. This process is similar to the cleaning operation (E) described above, and also uses the "RCA" method. Again, other cleaning processes known in the art are acceptable. After cleaning, the wafer is dried by spin or IPA vapor drying and stored prior to shipment.

In view of the above, it will be seen that the several objects of the invention are achieved. As various changes could be made in the above-described wafer fabricating process without departing from the scope of the invention, it is intended that all matter contained in the above description be interpreted as illustrative and not in a limiting sense.

What is claimed is:

1. A process for fabricating a semiconductor wafer with extrinsic gettering, the semiconductor wafer having a front surface and a back surface, the process comprising the steps in order of:

subjecting the front surface and the back surface of the wafer to a double side polishing operation to concurrently and uniformly remove material from the front surface and the back surface of the wafer, flatten the front and back surfaces and create damage on both the front surface and the back surface of the wafer during polishing, the damage on the back surface of the wafer providings gettering sites for extrinsic gettering of impurities from the front surface of the wafer during subsequent processing and device manufacturing;

subjecting the front surface of the wafer to a plasma assisted chemical etching operation so that damage on the front surface of the wafer is removed and the wafer is flattened; and subjecting the front surface of the wafer to a touch polishing operation to increase the gloss on the front surface.

2. The process as set forth in claim 1 wherein the wafer is further subjected to an etching operation prior to the double side polishing operation.

3. The process as set forth in claim 2 wherein the wafer is subjected to a cleaning operation after the double side polishing operation but prior to the plasma assisted chemical etching operation.

4. The process as set forth in claim 3 wherein the wafer is further subjected to a water rinsing operation after the plasma assisted chemical etching operation but prior to the touch polishing operation.

5. The process as set forth in claim 4 wherein the wafer is further subjected to a final cleaning after the touch polishing.

6. The process as set forth in claim 1 wherein a polishing slurry is used in the double side polishing operation, the polishing slurry being selected from the group consisting of alumina in water, alumina in glycerin, cerium oxide in water, and cerium oxide in glycerin.

7. The process as set forth in claim 6 wherein the pH of the polishing slurry is between about 6 and about 10.5.

8. The process as set forth in claim 5 wherein the total thickness variation of the wafer is less than about 1 micrometer after the double side polishing operation.

9. The process as set forth in claim 5 wherein between about 1 and about 10 micrometers of material is removed from the front surface of the wafer during the plasma assisted chemical etching operation so that the wafer has a total thickness variation between about 0.1 and about 0.8 micrometers.

10. The process as set forth in claim 5 wherein between about 0.2 and about 10 micrometers of material is removed in the touch polish operation so the wafer has a resulting total thickness variation of between about 0.1 and about 0.4 micrometers.

11. The process as set forth in claim 5 wherein between about 0.2 and about 10 micrometers of material is removed in the touch polish operation so the wafer has a resulting total thickness variation of between about 0.1 and about 0.4 micrometers.

12. A process for fabricating a semiconductor wafer with extrinsic gettering, the semiconductor wafer having a front surface and a back surface, the process comprising the steps in order of:

slicing the wafer from a single crystal ingot;

subjecting the wafer to an etching operation to remove slicing residue from the wafer;

subjecting the front surface and the back surface of the wafer to a double side polishing operation to concurrently and uniformly remove material from the front surface and the back surface of the wafer and create damage on both the front surface and the back surface of the wafer during polishing, the damage on the back surface of the wafer providing gettering sites for extrinsic gettering of impurities from the front surface of the wafer during subsequent processing and device manufacturing;

subjecting the wafer to a cleaning operation to remove contaminants from the wafer;

subjecting the front surface of the wafer to a plasma assisted chemical etching operation so that damage on the front surface of the wafer is removed and the wafer is flattened;

subjecting the wafer to a water rinsing operation to remove contaminants generated during the plasma assisted chemical etching operation;

subjecting the front surface of the wafer to a touch polishing operation to increase the gloss on the front surface; and subjecting the wafer to a final cleaning operation to remove particulates on the wafer surfaces.

13. The process as set forth in claim 12 wherein between about 0.2 and about 10 micrometers of material is removed in the final touch polish operation so the wafer has a resulting total thickness variation of between about 0.1 and about 4 micrometers.

14. The process as set forth in claim 12 wherein between about 0.2 and about 10 micrometers of material is removed in the final touch polish operation so the wafer has a resulting total thickness variation of between about 0.1 and about 0.4 micrometers.

15. The process as set forth in claim 12 wherein a polishing slurry is used in the double side polishing operation, the polishing slurry being selected from the group consisting of alumina in water, alumina in glycerin, cerium oxide in water, and cerium oxide in glycerin.

16. A process for fabricating a semiconductor wafer with extrinsic gettering, the semiconductor wafer having a front surface and a back surface, the process comprising the steps in order of:

subjecting the front surface and the back surface of the wafer to a double side polishing operation to concurrently and uniformly remove material from the front surface and the back surface of the wafer, flatten the front and back surfaces and create damage on both the front surface and the back surface of the wafer during polishing, the damage on the back surface of the wafer providing gettering sites for extrinsic gettering of impurities from the from surface of the wafer during subsequent processing and device manufacturing; and subjecting the front surface of the wafer to at least one material removal operation for removing damage created in the double side polishing operation.

17. The process as set forth in claim 16 wherein a polishing slurry is used in the double side polishing operation, the polishing slurry being selected from the group consisting of alumina in water, alumina in glycerin, cerium oxide in water, and cerium oxide in glycerin.

* * * * *

UNITED STATES PATENT AND TRADEMARK OFFICE
CERTIFICATE OF CORRECTION

PATENT NO. : 6,338,805 B1
DATED : January 15, 2002
INVENTOR(S) : Gary L. Anderson It is certified that error appears in the above-identified patent and that said Letters Patent is hereby corrected as shown below:

<u>Column 6,</u>
Line 6, "providings gettering" should read -- providing gettering --.

Signed and Sealed this

Ninth Day of July, 2002

*Attest:*

*Attesting Officer*

JAMES E. ROGAN
*Director of the United States Patent and Trademark Office*